(12) United States Patent  (10) Patent No.: US 9,263,653 B2
Facer et al.  (45) Date of Patent: Feb. 16, 2016

(54) LIGHT-EMISSIVE DEVICES AND LIGHT-EMISSIVE DISPLAYS

(71) Applicant: Empire Technology Development LLC, Wilmington, DE (US)

(72) Inventors: Geoffrey R. Facer, Lane Cove (AU); Micheal J. Nicholls, Freemans Reach (AU)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/278,505

(22) Filed: May 15, 2014

(65) Prior Publication Data

US 2015/0333237 A1    Nov. 19, 2015

(51) Int. Cl.
*H01L 33/60* (2010.01)
*H01L 33/44* (2010.01)
*H01L 33/08* (2010.01)

(52) U.S. Cl.
CPC .............. *H01L 33/60* (2013.01); *H01L 33/08* (2013.01); *H01L 33/44* (2013.01); *H01L 2933/0016* (2013.01); *H01L 2933/0025* (2013.01); *H01L 2933/0058* (2013.01)

(58) Field of Classification Search
CPC .......... H01L 33/58; H01L 33/60; H01L 33/62
See application file for complete search history.

(56) References Cited

U.S. PATENT DOCUMENTS

| 7,534,633 B2 | 5/2009 | Batres et al. |
| 8,415,181 B2 | 4/2013 | Kim et al. |
| 2008/0117500 A1* | 5/2008 | Narendran et al. ........... 359/326 |
| 2011/0116262 A1 | 5/2011 | Marson |
| 2013/0215598 A1 | 8/2013 | Guzan et al. |
| 2014/0145226 A1* | 5/2014 | Hohn .............................. 257/98 |

FOREIGN PATENT DOCUMENTS

EP    2033244 B1    12/2009

OTHER PUBLICATIONS

How to Model LEDs and Other Complex Sources, Mark Nicholson, Aug. 26, 2005.
InGaN gallium nitride light-emitting diodes with reflective electrode pads and textured gallium-doped ZnO contact layer, S. H. Tu, C. J. Lan, S. H. Wang, M. L. Lee, K. H. Chang et al., Applied Physics Letters, 2010.

(Continued)

*Primary Examiner* — Yu-Hsi D Sun
(74) *Attorney, Agent, or Firm* — Maschoff Brennan

(57) ABSTRACT

In some embodiments, a light-emissive device may include a reflector assembly, a dielectric layer, an electrode pin, a second semiconductor, and an electrode connector. The reflector assembly may define a cavity, a light opening, and an electrode pin opening. The dielectric layer may be positioned adjacent to the reflector assembly. The dielectric layer may define an electrode pin aperture and an electrode connector aperture. The electrode pin may include a head and a shaft. The head may be positioned in the cavity and coated with a first semiconductor. The shaft may be at least partially positioned in the electrode pin opening and through-mounted to the electrode pin aperture. The second semiconductor may be disposed in the cavity. The second semiconductor may surround the first semiconductor. The electrode connector may be electrically coupled to the second semiconductor and through-mounted to the electrode connector aperture.

22 Claims, 8 Drawing Sheets

(56) References Cited

OTHER PUBLICATIONS

What are LED Lamps? Marktech Optoelectronics, Inc., 2013.
Microcavity top-emitting organic light-emitting devices integrated with microlens arrays: Simultaneous enhancement of quantum efficiency, cd/A efficiency, color performances, and image resolution, Yang et al., Applied Physics Letters, 2007.
Low-Shrink OP-67-LS Precision Positioning Optical Adhesive, Dymax, Optical Adhesives OP-67-LS Product Data Sheet, Sep. 4, 2013.
Different Types of Wood Filler and Wood Putty, http://www.woodfloordoctor.com/_product_reviews/articles/different_types_of_wood_filler_and_wood_putty.shtml, 2012.
"OLED," accessed at http://web.archive.org/web/20140426224739/http://en.wikipedia.org/wiki/OLED, last modified on Apr. 9, 2014, pp. 1-28.
Ummartyotin, S., "Deposition of PEDOT: PSS Nanoparticles as a Conductive Microlayer Anode in OLEDs Device by Desktop Inkjet Printer," Journal of Nanomaterials, vol. 2011, Article ID 606714, pp. 7 (2011).

* cited by examiner

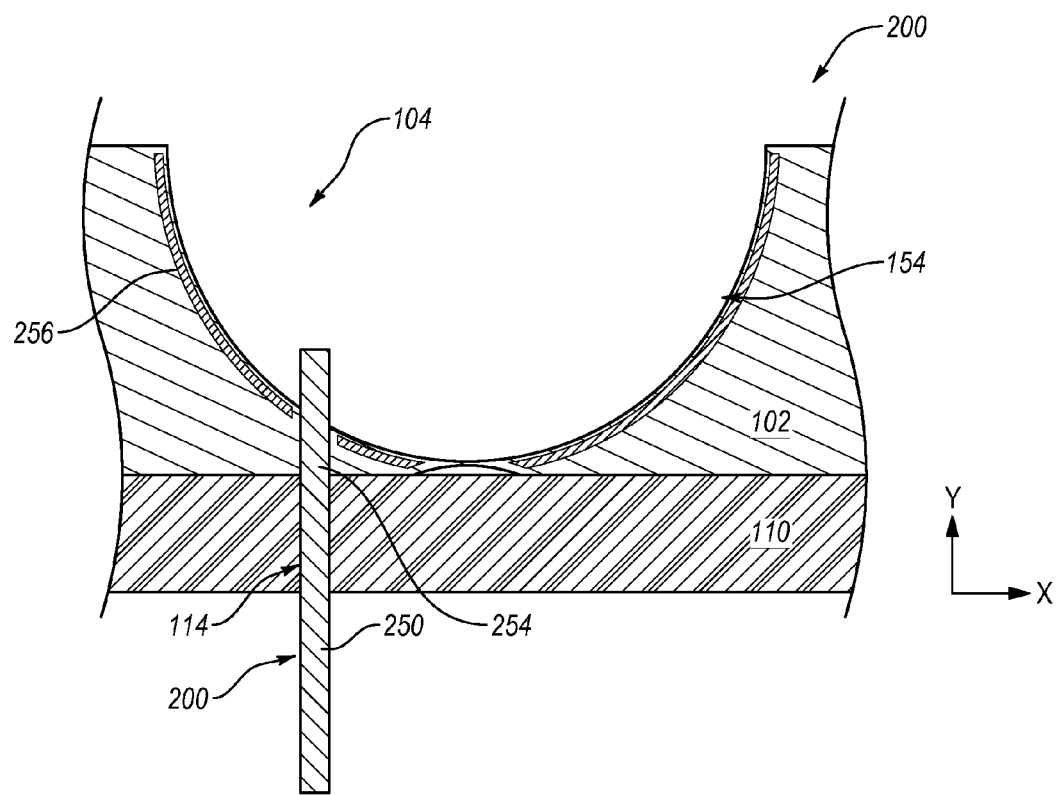
*Fig. 2C*
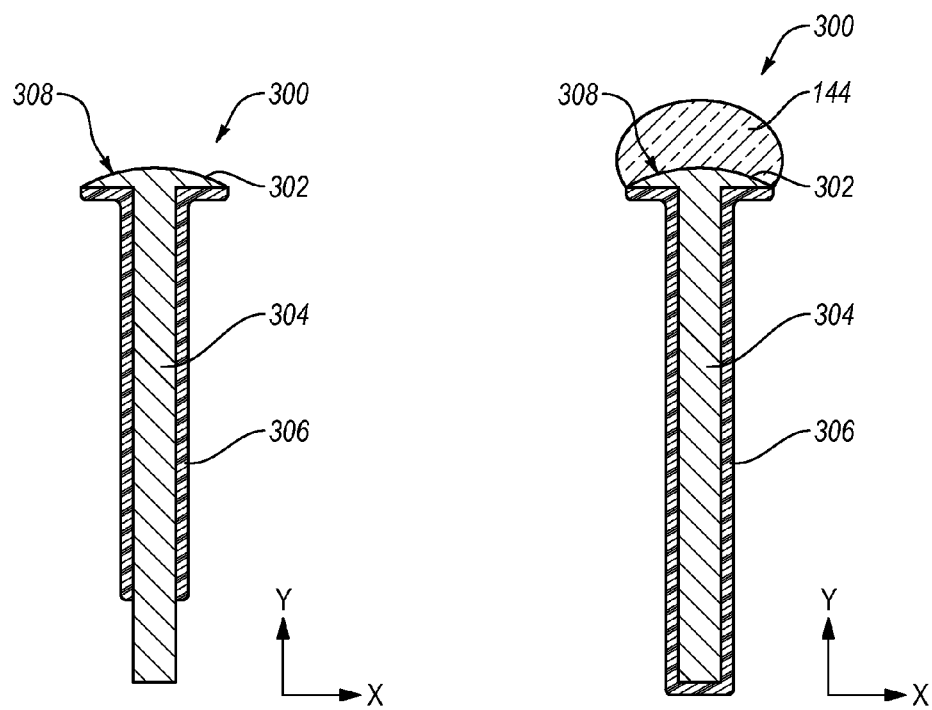
*Fig. 3A*  *Fig. 3B*

LIGHT-EMISSIVE DEVICES AND LIGHT-EMISSIVE DISPLAYS

BACKGROUND

Unless otherwise indicated herein, the materials described herein are not prior art to the claims in the present application and are not admitted to be prior art by inclusion in this section.

Generally, light-emissive displays include multiple light-emissive devices such as light-emitting diodes (LEDs). The multiple light-emissive devices may be arranged in an array. The light-emissive displays may be used in curing processes or to illuminate a target surface at a given distance, for instance. Manufacturing of light-emissive displays includes manufacturing of the multiple light-emissive devices in a specific arrangement. Such manufacturing may be complex and expensive.

SUMMARY

Techniques described herein generally relate to light-emissive devices and light-emissive displays.

In some embodiments, a light-emissive device may include a reflector assembly, a dielectric layer, an electrode pin, a second semiconductor, and an electrode connector. The reflector assembly may define a cavity, a light opening, and an electrode pin opening. The dielectric layer may be positioned adjacent to the reflector assembly. The dielectric layer may define an electrode pin aperture and an electrode connector aperture. The electrode pin may include a head and a shaft. The head may be positioned in the cavity and coated with a first semiconductor. The shaft may be at least partially positioned in the electrode pin opening and through-mounted to the electrode pin aperture. The second semiconductor may be disposed in the cavity. The second semiconductor may surround the first semiconductor. The electrode connector may be electrically coupled to the second semiconductor and through-mounted to the electrode connector aperture.

In some embodiments, a light-emissive device may include a reflector assembly, an electrode pin, a second semiconductor, a dielectric layer, and a lens sheet. The reflector assembly may include a protrusion and a conductive surface that at least partially defines a cavity and a tapered channel of the protrusion. The reflector assembly may define a light opening and an electrode pin opening opposite the light opening. The electrode pin may include a head and a shaft. The head may be domed. The head maybe positioned in the cavity and may be coated with a first semiconductor and the shaft may be partially positioned in the electrode pin opening and may be at least partially coated with an insulating coating. The second semiconductor may be disposed in the cavity. The second semiconductor may surround the first semiconductor. The dielectric layer may be mounted to the reflector assembly. The dielectric layer may define an electrode pin aperture into which the electrode pin is through-mounted and an electrode connector aperture into which the protrusion may be through-mounted. The lens sheet may be positioned over the light opening.

In some embodiments, a method of manufacturing a light-emissive device may include mounting a dielectric layer to a reflector assembly. The dielectric layer may define an electrode pin aperture and an electrode connector aperture. The reflector assembly may define a cavity. The method may also include through-mounting an electrode connector to the electrode connector aperture. The method may also include at least partially positioning an electrode pin in the cavity, including positioning a shaft of the electrode pin within an electrode pin hole defined in the reflector assembly, positioning a head of the electrode pin within the cavity, and through-mounting the shaft of the electrode pin to the electrode pin aperture. The method may also include coating the head of the electrode pin with a first semiconductor. The method may also include depositing a second semiconductor in the cavity such that the second semiconductor surrounds the first semiconductor and may be electrically coupled to the electrode connector.

In some embodiments, a light-emissive device may include a reflector assembly, an electrode pin, a first semiconductor, a second semiconductor, and an electrical connector. The reflector assembly may define an electrode pin opening and a cavity having a light opening. The electrode pin may include a head and a shaft. The head may be positioned in the cavity and the shaft may extend through the electrode pin opening. The first semiconductor may be located on the head of the electrode pin. The second semiconductor may at least partially fill the cavity. The second semiconductor may form an emissive interface with the first semiconductor. The electrical connector may be electrically coupled to the second semiconductor.

In some embodiments, a light-emissive display (display) may include multiple light-emissive devices. Each light-emissive device may include a reflector assembly, an electrode pin, a first semiconductor, a second semiconductor, and an electrical connector. The reflector assembly may define an electrode pin opening and a cavity that may have a light opening. The electrode pin may include a head and a shaft. The head may be positioned in the cavity and the shaft may extend through the electrode pin opening. The first semiconductor may be located on the head of the electrode pin. The second semiconductor may at least partially fill the cavity. The second semiconductor may form an emissive interface with the first semiconductor. The electrical connector may be electrically coupled to the second semiconductor.

In some embodiments, a method of fabricating a light-emissive device may include forming a reflector assembly including a concave reflective surface that partially surrounds a cavity. The method may also include positioning an electrode pin including a shaft and a head such that the head may be located in the cavity and the shaft extends through an electrode pin opening defined in the reflector assembly. The method may also include coating the head of the electrode pin with a first semiconductor. The method may also include depositing a second semiconductor in the cavity such that the second semiconductor forms an emissive interface with the first semiconductor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

Various features of this disclosure will become more fully apparent from the following description, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. In the drawings:

FIG. 2C is a diagram of another example embodiment of an electrode connector that may be included in the light-emissive device of FIG. 1;

FIGS. 3A and 3B are diagrams of an example embodiment of an electrode pin that may be included in the light-emissive device of FIG. 1;

DETAILED DESCRIPTION

Figure 1:
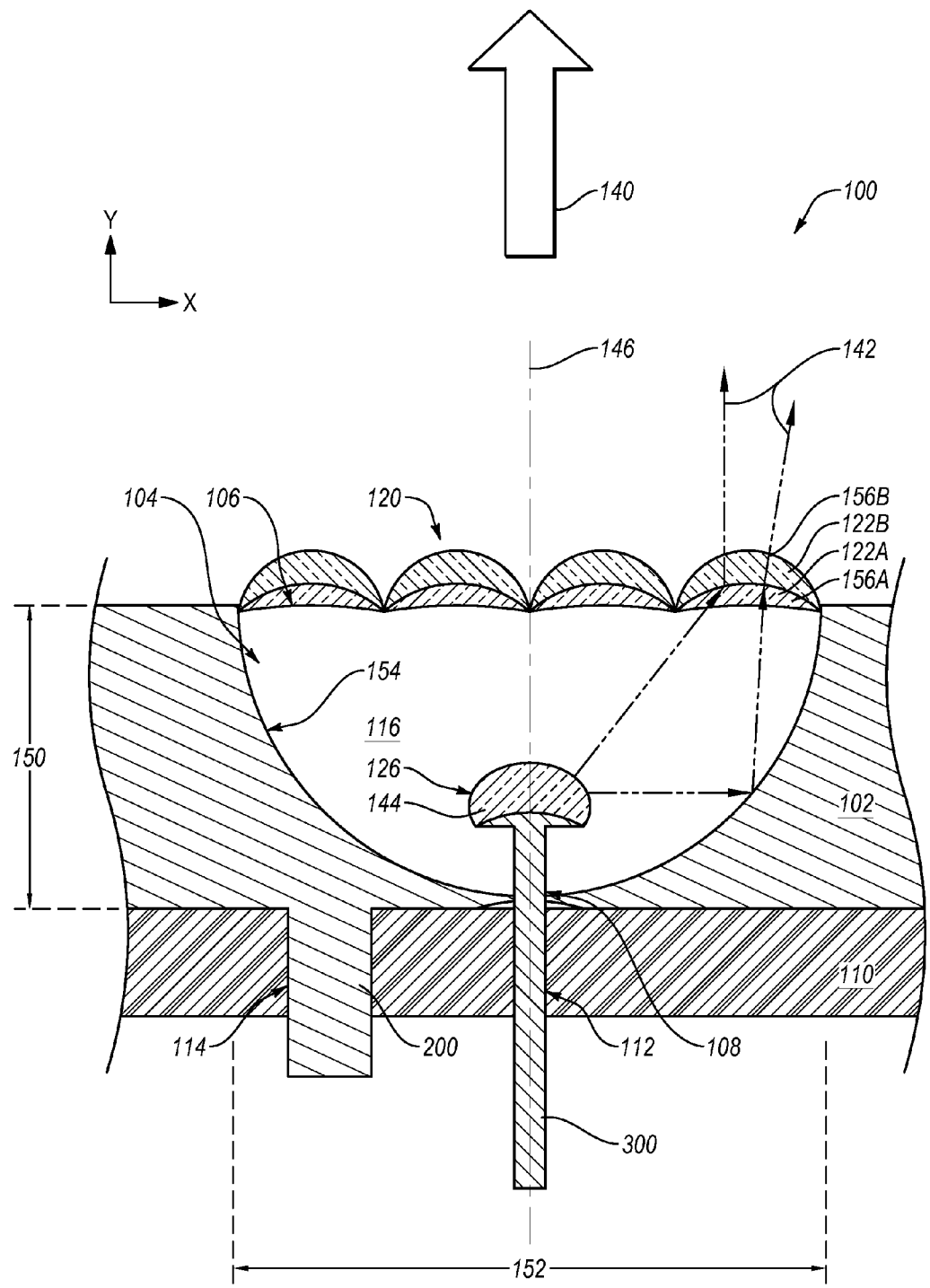
FIG. 1 is a diagram of an example light-emissive device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, light-emissive devices, systems, and methods of manufacturing related to light-emissive devices and light-emissive displays. In an example embodiment a light-emissive device may include a reflector assembly, a dielectric layer, an electrode pin, a second semiconductor, and an electrode connector. The reflector assembly may define a cavity, a light opening, and an electrode pin opening. The dielectric layer may be positioned adjacent to the reflector assembly. The dielectric layer may define an electrode pin aperture and an electrode connector aperture. The electrode pin may include a head and a shaft. The head may be positioned in the cavity and coated with a first semiconductor. The shaft may be at least partially positioned in the electrode pin opening and through-mounted to the electrode pin aperture. The second semiconductor may be disposed in the cavity. The second semiconductor may surround the first semiconductor. The electrode connector may be electrically coupled to the second semiconductor and through-mounted to the electrode connector aperture.

Additionally, an example embodiment may include a method of manufacturing the light-emissive device. The method may include forming a reflector assembly including a concave reflective surface that partially surrounds a cavity. The method may also include positioning an electrode pin including a shaft and a head such that the head may be located in the cavity and the shaft extends through an electrode pin opening defined in the reflector assembly. The method may also include coating the head of the electrode pin with a first semiconductor. The method may also include depositing a second semiconductor in the cavity such that the second semiconductor forms an emissive interface with the first semiconductor.

These and other embodiments described herein may provide scalable fabrication. Additionally, the light-emissive device may integrate the dielectric layer, which may reduce manufacturing costs and facilitate integration of the light-emissive device with other systems. Additionally, some embodiments may use semiconductors that may be pourable and/or solution-processable. For example, organic light-emitting diode (OLED) electron transport layers may be used in conjunction with a pourable OLED hole transport layer. Moreover, these and other embodiments may maximize an amount of light emitted from the light-emissive device. Specifically, a size of an emissive interface between the first semiconductor and a second semiconductor may be increased in the light-emissive device, which may increase light emission.

Example light-emissive devices may be configured as lighting elements, for the interior or exterior of buildings, for example. In some embodiments, light emission from the light-emissive devices may be substantially monochromatic. In some embodiments, blue, violet, or ultraviolet (UV) emission may be used to provide an approximate white-light emission. Wavelength of the emission may be determined at least partially using an additional luminophore, which may be deposited on an interior of a lens panel, for example. In some embodiments, a combination of wavelengths may be obtained to approximate white light. For example, a blue wavelength and an orange wavelength or a red wavelength, a green wavelength, and a blue wavelength may be combined to emit a white light. Additionally or alternatively, one or more electrode pins may be used to obtain different wavelength emission and/or one or more of the electrode pins may include one or more semiconductor regions, which may affect or result in polychromatic emission.

Example applications of the light-emissive devices and light-emissive displays described herein may include light fixtures. The light fixtures may include strip light replacements for conventional fluorescent lamps and lamp replacements for incandescent and compact fluorescent bulbs. In some embodiments, a light-emissive device may be electrically and mechanically configured to fit within a conventional incandescent light fixture or fluorescent lamp (e.g. tube) fixture. Electrical circuitry may be included in the light-emissive devices to provide drive signals from a received input power supply. In some embodiments ballast components may not be required, which may reduce costs. Other example applications may include video displays such as television displays, computer displays, mobile device displays, and large-scale displays in particular, advertising panel displays having a display diagonal in excess of sixty inches. Display device size may be readily scaled to obtain larger display panels, as required. These and other embodiments are described with reference to the Figures included herewith.

FIG. 1 is a diagram of an example light-emissive device 100, arranged in accordance with at least some embodiments described herein. Specifically, FIG. 1 depicts a sectional view of the light-emissive device 100. The light-emissive device 100 may be configured to emit light 142 in a target direction, generally indicated in FIG. 1 by arrow 140. The light 142 may generally be emitted from an emissive interface (interface) 126 formed between a first semiconductor 144 and a second semiconductor 116.

Specifically, in response to an electrical signal being applied across the interface 126, emission of the light 142 may be induced as holes in the first or second semiconductor 144 or 116 and electrons in the other of the first or second semiconductor 144 or 116 combine at or near the interface 126 to emit photons. The light-emissive device 100 may include a light-emitting diode (LED) or an organic LED (OLED) in some embodiments, depending on compositions of the first semiconductor 144 and the second semiconductor 116.

In non-illustrated embodiments, the second semiconductor 116 may be disposed in the cavity 104. The second semiconductor 116 may form a semiconductor junction (similar to the interface 126) with the first semiconductor 144. The semiconductor junction may be configured to emit light on application of an appropriate electrical driving signal. The semiconductor junction may generally conform to the surface of an electrode pin 300, for example being spaced apart from the electrode pin 300 by a layer of the first semiconductor 144 and an optional carrier blocking layer (not shown).

The light-emissive device 100 may include a reflector assembly 102. The reflector assembly 102 may be composed at least partially of an insulator material such as a plastic or a flexible polymer sheet. Alternatively or additionally, the reflector assembly 102 may be composed of a metal. Alternatively or additionally, the reflector assembly 102 may include an insulator material that may be at least partially coated with an electrically conductive material and/or a reflective material.

The reflector assembly 102 may define a cavity 104, a light opening 106, and an electrode pin opening 108. The cavity 104 may have cross-section that may be shaped as a parabola or a semicircle. For example, the cross-section of the cavity 104 may be defined according to an x-dimension 152 and a y-dimension 150. The x-dimension 152 and the y-dimension 150 are defined according to an arbitrarily-oriented coordinate system. In some embodiments, the x-dimension 152 may increase in length as the y-dimension 150 increases away from the electrode pin opening 108. In some embodiments, a relationship between the x-dimension 152 and the y-dimension 150 of the cross-section may not be linear. For instance, the cross-section may include a relatively flatter portion near the electrode pin opening 108 and a relatively steeper portion near the light opening 106. Additionally, in these and other embodiments, the cross-section may include a steeper portion near the electrode pin opening 108 and a flatter portion near the light opening 106.

The cavity 104 may be rotationally symmetric or substantially rotationally symmetric about an axis 146. For example, in embodiments in which the cavity 104 includes the cross section that is a parabola, the cavity 104 may be an elliptic paraboloid or a concave parabolic cup. In addition, in embodiments in which the cavity includes the cross section that is a semicircle, the cavity 104 may be a hemisphere. In these and other embodiments, the cavity 104 may have a depth in a z-direction that is orthogonal to a plane defined by the x-dimension 152 and the y-dimension 150.

For purposes of the discussion that follows, the previously mentioned and arbitrarily-oriented coordinate system may include an x axis parallel to the x-dimension 152, a y axis parallel to the y-dimension 150, and a z-axis parallel to the z-direction. The x, y, and z axes may be mutually orthogonal. The x and y axes may define an xy plane, the x and z axes may define an xz plane, and the y and z axes may define a yz plane.

The cavity 104 may enable the light 142 emitted from the interface 126 to reflect from a cavity surface 154 of the cavity 104 and exit the light-emissive device 100 substantially in the target direction 140. In some embodiments some portion of the cavity surface 154 may be coated with a reflective material, which may constitute a concave reflecting surface (not shown in FIG. 1). The concave reflecting surface may be configured to reflect the light 142. The concave reflecting surface may at least partially coat the cavity surface 154. For example, the concave reflecting surface may extend along a circumference of the cavity 104 over a range of the y-dimension 150.

Additionally, the shape of the cavity 104 may at least partially dictate an amount and/or a direction of the light 142 reflected from the cavity surface 154. For example, in some embodiments of the cavity 104 that include a relatively flatter portion near the electrode pin opening 108, more of the light 142 may reflect in the target direction 140 than embodiments of the cavity 104 that include a relatively steeper portion near the electrode pin opening 108. Additionally or alternatively, in some embodiments, the cavity 104 may further include luminophores (such as fluorophores, quantum structures such as quantum dots, and the like) which may modify (e.g. broaden) the spectral emission spectrum of the light-emissive device 100.

In some embodiments, the light 142 may exit the light-emissive device through the light opening 106. The light opening 106 may form a border of the cavity 104. In embodiments in which the cavity is rotationally symmetric about the axis 146, the light opening 106 may be substantially circular in a plane substantially parallel to the xz plane.

In some embodiments, the light opening 106 may be generally circular with an opening diameter in the range of about 100 microns to about 1 centimeters (cm). Example light-emissive devices 100 may include a light opening 106 having a diameter in a range of about 0.5 millimeters (mm) to about 10 mm, which may allow a greater light output than conventional light-emitting diodes. Dimensional ranges are not limiting, and may be approximate and/or inclusive in some embodiments.

In some embodiments, the light opening 106 may be elongated. In these and other embodiments, the reflector assembly 102 may include multiple electrode pin openings (e.g., electrode pin opening 108). The multiple electrode pin openings may be configured to receive pins (e.g., 300) at intervals along a direction of elongation.

The electrode pin opening 108 may be defined opposite the light opening 106. The electrode pin opening 108 may be defined to receive the electrode pin 300. For example, a diameter or another dimension of the electrode pin opening 108 may be complementary to a diameter or another corresponding dimension of the electrode pin 300. The electrode pin opening 108 may be substantially circular in a plane substantially parallel to the xz plane or may have another shape that may be complementary to a shape of the electrode pin 300.

A dielectric layer 110 may be positioned adjacent to the reflector assembly 102. The dielectric layer 110 may generally support the reflector assembly 102 and may enable electrical connections between one or more traces (not shown) and one or more components (e.g., 300, 200, and 208) included in the light-emissive device 100. In some embodiments, the dielectric layer 110 may be positioned adjacent to the reflector assembly 102.

The dielectric layer 110 may include a printed circuit board (PCB), a support board, a circuit board, or other suitable dielectric layer. In some embodiments, the dielectric layer 110 may be part of a PCB used to support an electronic circuit, such as a circuit for switching, dimming, or otherwise electrically controlling light 142 emitted by the light-emissive device 100. In some embodiments, the dielectric layer 112 may be flexible, for example being formed as a flexible electrically insulating polymer sheet.

The dielectric layer 110 may define an electrode pin aperture (pin aperture) 112 and an electrode connector aperture (connector aperture) 114. The pin aperture 112 may be configured to receive the electrode pin 300. The pin aperture 112 may substantially align with the electrode pin opening 108. For example, the pin aperture 112 may align with the electrode pin opening 108 such that the electrode pin 300 may be positioned in the pin aperture 112 and the electrode pin opening 108. The connector aperture 114 may be configured to receive an electrode connector 200. In some embodiments, when the electrode pin 300 is received in the pin aperture 112 and/or the electrode connector 200 is received in the connector aperture 114, the electrode pin 300 and/or the electrode connector 200 may be through-mounted to the dielectric layer 110. Generally, through-mounting refers to a mounting scheme in which leads of components such as the electrode pin 300 and the electrode connector 200 may be inserted into holes such as the pin aperture 112 and/or the connector aperture 114 and soldered to pads on the dielectric layer 110. Through-mounting the electrode connector 200 and/or the electrode pin 300 may secure the dielectric layer 110 to the reflector assembly 102.

The electrode pin 300 may be at least partially positioned in the cavity 104. For example, the electrode pin 300 may be at least partially positioned in the electrode pin opening 108 and through-mounted to the pin aperture 112. The first semiconductor 144 may coat a portion of the electrode pin 300 positioned in the cavity 104.

In some embodiments, the dielectric layer 110 may be omitted. In these and other embodiments a mechanical framework or other mechanical configuration may be used to support the electrode pin 300. In some embodiments, the electrode pin 300 may be mechanically attached to the reflector assembly 102, e.g. at the pin aperture 112, and the portion of the electrode pin 300 outside of the cavity 104 may define an electrode to which an electrical connection may be made.

Additionally or alternatively, the electrode connector 200 may be electrically coupled to the second semiconductor 116 and through-mounted to the electrode connector aperture 114. In some embodiments, a portion of the reflector assembly 102 may be electrically conducting and provide at least part of an electrical path between the second semiconductor 116 and the electrode connector 200.

The second semiconductor 116 may be disposed in the cavity 104. For example, the second semiconductor 116 may completely, substantially, or partially fill a volume of the cavity 104. In some embodiments, the second semiconductor 116 may be formed by introducing a liquid precursor into the cavity 104 and curing the liquid precursor.

The second semiconductor 116 may surround the first semiconductor 144 coating the portion of the electrode pin 300. The interface 126 may be defined between the first semiconductor 144 and the second semiconductor 116 and may include a surface of the first semiconductor 144 that may be in contact with a surface of the second semiconductor 116. The electrode connector 200 may be electrically coupled to the second semiconductor 116. For example, the electrode connector 200 may directly contact the second semiconductor 116. Alternatively, the cavity 104 may be at least partially coated with an electrically conductive material. The electrically conductive material may contact or may be adjacent to the second semiconductor 116 and/or the electrode connector 200 such that the electrical signal may be communicated between the second semiconductor 116 and the electrode connector 200 through the electrically conductive material. In some embodiments, the electrode connector 200 may be through-mounted to the connector aperture 114.

To induce emission of the light 142, the electrical signal may be communicated along the electrode connector 200 to the second semiconductor 116. The electrical signal may include a unidirectional or direct current (DC) electrical signal. When the electrical signal is applied at the second semiconductor 116, electrons may be excited in the second semiconductor 116 and may move across the interface 126 to combine with holes in the first semiconductor 144. When the electrons combine with the holes, the light 142 may be emitted. The electrical signal may also be communicated along the electrode pin 300 to the first semiconductor 144. When the electrical signal is applied at the first semiconductor 144, electrons may be excited in the first semiconductor 144 and may move across the interface 126 to combine with holes in the second semiconductor 116. When the electrons combine with the holes, the light 142 may be emitted.

In some embodiments, an insulating polymer (or other electrical insulator) may be introduced into the cavity 104. The insulating polymer may prevent or reduce unwanted electrical connections. For example an insulating polymer may be introduced to surround any portion of the electrode pin 300 that is not otherwise surrounded by the first semiconductor 144 in the light-emissive device 100.

As mentioned above, examples of the light-emissive device 100 may include an LED (e.g., an LED including liquid and/or pourable semiconductors), an OLED, or another similar light-emissive device. The nature of the light-emissive device 100, e.g., as an LED or an OLED, may be based at least partially on compositions of the first semiconductor 144 and the second semiconductor 116. Moreover, selection of the first semiconductor 144 and/or the second semiconductor 116 may be based electro-chemical properties and/or manufacturing properties. For example, selection of the first semiconductor 144 and/or the second semiconductor 116 may be based on electoral conductivity, band gap, susceptibility to or response to doping, absorption, photoluminescence, charge-carrier transport properties, flexibility, viscosity, response to curative processes, and the like.

In these and other embodiments, the first semiconductor 144 may include a p-type semiconductor and the second semiconductor 116 may include an n-type semiconductor. Additionally or alternatively, the second semiconductor 116 may include a p-type semiconductor and the first semiconductor 144 may include an n-type semiconductor. Additionally or alternatively, the first semiconductor 144 may include a first organic semiconductor and the second semiconductor 116 may include a second organic semiconductor. Additionally or alternatively, the first semiconductor 144 may include a hole transport material and the second semiconductor 116 may include an electron transport material. Additionally or alternatively, the second semiconductor 116 may include a hole transport material and the first semiconductor 144 may include an electron transport material. Additionally or alternatively, the first semiconductor 144 and the second semiconductor 116 may each include a molecular semiconductor material or a polymeric semiconductor material.

The first semiconductor 144 and/or the second semiconductor 116 may include enhancements such as metal ion complexes or fullerenes. The first semiconductor 144 and/or the second semiconductor 116 may include, at least during some portion of the manufacture of the light-emissive device 100 and/or prior to curing, pourable (e.g., fluids) materials and/or solution-processable materials, which may facilitate manufacturing.

In an example embodiment, the first semiconductor 144 may include an oxadiazole molecule and an electron hole blocker material. In this and other example embodiments, the second semiconductor 116 may include one or more of poly (p-phenylene vinylene), poly(9,9-dioctylfluorene-co-N-(4-(3-methylpropyl))diphenylamine), polyfluorene, and poly(3, 4-ethylenedioxythiophene)-poly(styrenesulfonate) ("PEDOT-PSS").

In some embodiments, the first semiconductor 144 and/or second semiconductor 116 may include a polymeric semiconductor. A first polymeric semiconductor 144 may be deposited on the electrode pin 300 by any appropriate method, and in some embodiments the polymeric semiconductor may be deposited on the electrode pin 300 before the electrode pin 300 is located in the cavity 104. A second polymeric semiconductor 116 may be deposited into the cavity 104 so as to fill at least a portion of the cavity 104 and to electrically contact the first polymeric semiconductor 144. Polymeric semiconductors may be deposited using solution processing, pouring, spraying, mist deposition, dipping, printing, in-situ polymerization of deposited precursors, or using any appropriate method.

In some embodiments, the light-emissive device 100 may include a secondary emissive layer. The secondary emissive layer may be positioned between the first semiconductor 144 and the second semiconductor 116. For example, the secondary emissive layer may be positioned at the interface 126. In some embodiments, the secondary emissive layer may be applied to the first semiconductor 144. The second semiconductor 116 may then be disposed in the cavity 104 to surround the secondary emissive layer and the first semiconductor 144. The secondary emissive layer may enhance the light emission efficiency of the light-emissive device 100. secondary emissive layer The light-emissive device 100 may include a lens sheet 120. The lens sheet 120 may be positioned over the light opening 106 and/or against the second semiconductor 116. The lens sheet 120 may be configured to focus and/or control an angular distribution of the light 142 emitted by the light-emissive device 100. In some embodiments, the lens sheet 120 may include a multi-layer array. In some embodiments, each layer in the multi-layer array may be composed of a different material with a different refractive index. Additionally, one or more of the layers or portions thereof may be formed into one or more mini lenses.

The lens sheet 120 depicted in FIG. 1 includes a dual-layer array. Specifically, the lens sheet 120 may include a first layer 156A positioned against the second semiconductor 116. The first layer 156A may form one or more mini lenses. Specifically, in FIG. 1, the first layer forms a first mini lens 122A. Additionally, the lens sheet 120 may include a second layer 156B positioned against the first layer 156A. The second layer 156B may form one or more mini lenses. Specifically, in FIG. 1, the second layer forms a second mini lens 122B. The first mini lens 122A and/or the second mini lens 122B may be curved, convex, a converging lens, or some combination thereof. For example, the first mini lens 122A and/or the second mini lens 122B may be convex.

In FIG. 1, the first mini lens 122A in the first layer 156A and the second mini lens 122B in the second layer 156B are labeled. However, the first layer 156A and the second layer 156B include multiple other mini lenses. Specifically, the first layer 156A and the second layer 156B in FIG. 1 include four mini lenses each. More generally, in these and other embodiments the first layer 156A and the second layer 156B may include more than four mini lenses or fewer than four mini lenses. Additionally, in some embodiments, the mini lenses in the first layer 156A and/or the second layer 156B may be different sizes, thicknesses, and/or curvatures.

The first layer 156A may be composed of a first material having a first refractive index. The second layer 156B may be composed of a second material having a second refractive index. The second semiconductor 116 may be composed of a third material having a third refractive index. In some embodiments, the third refractive index may be higher (e.g., light travels slower through the third material) than the first refractive index. Additionally, the first refractive index may be higher than the second refractive index. Accordingly, refractive indexes of the layers may be increasingly-lower as a distance from the interface 126 increases.

In some embodiments, a difference between the first refractive index, the second refractive index, and the third refractive index may be minimized. By minimizing the differences between the first refractive index, the second refractive index, and the third refractive index, back reflection of the light 142 may be reduced.

Although the lens sheet 120 illustrated in FIG. 1 includes two layers, in other embodiments, the lens sheet 120 may include a monolithic structure. The monolithic structure may have a single refractive index or a refractive index gradient. For example, the refractive index of the monolithic structure may decrease as a distance from the interface 126 increases. More generally, in these and other embodiments, the lens sheet 120 may include three or more layers, each of which may form one or more mini lenses similar to those described above.

Figure 2B:
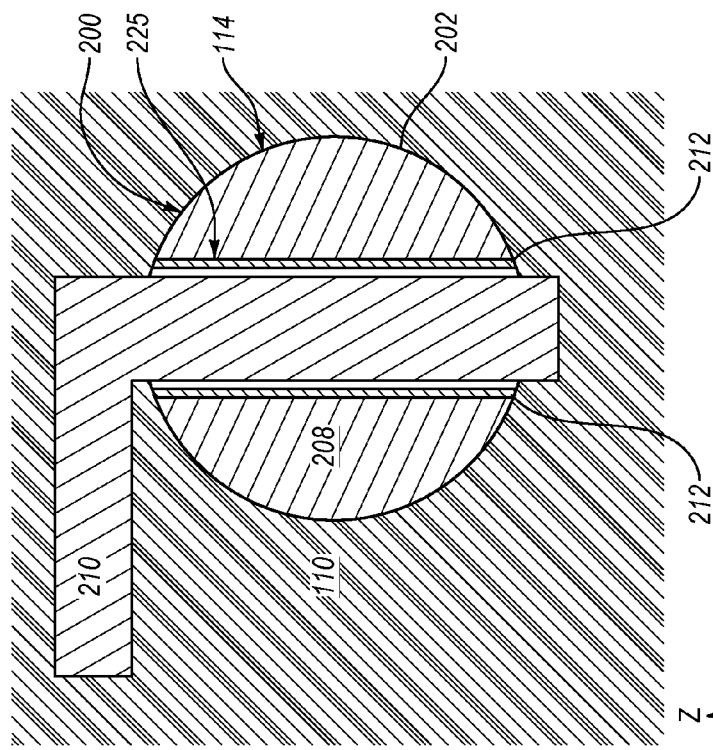
FIGS. 2A and 2B are diagrams of an example embodiment of an electrode connector that may be included in the light-emissive device of FIG. 1.
Figure 2A:
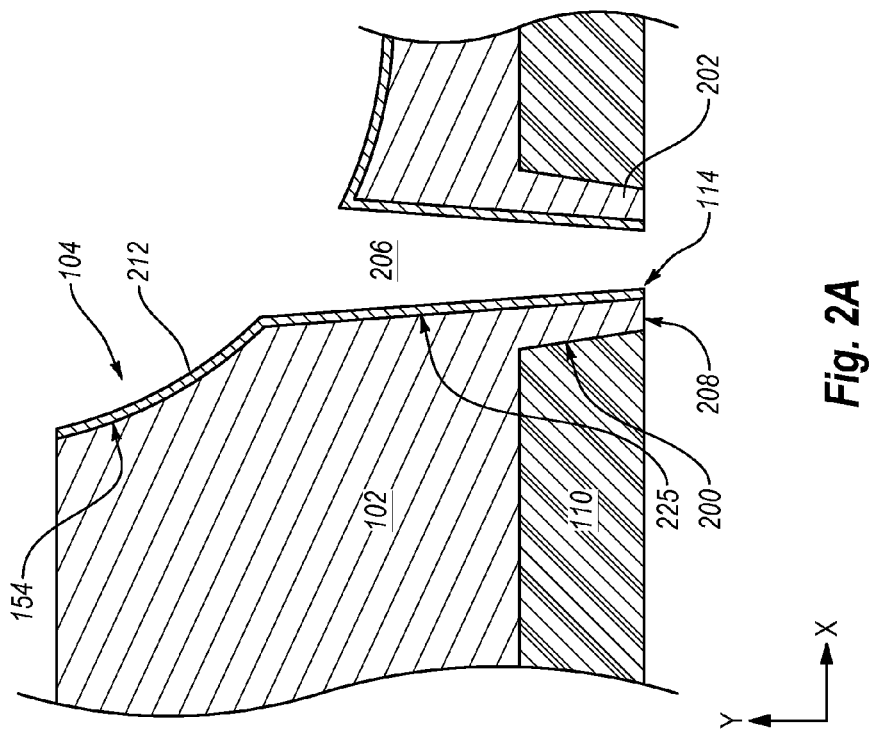

FIGS. 2A and 2B are diagrams of an example embodiment of the electrode connector 200 that may be included in the light-emissive device 100 of FIG. 1, arranged in accordance with at least some embodiments described herein. The electrode connector 200 in FIGS. 2A and 2B is depicted relative to the dielectric layer 110. Specifically, as depicted in FIGS. 2A and 2B, the electrode connector 200 is received in the connector aperture 114 of the dielectric layer 110.

The electrode connector 200 may include a protrusion 202 that may extend from the reflector assembly 102. For example, the protrusion 202 may be made as a single piece with the reflector assembly 102 or the protrusion 202 may be formed separately and later attached to the reflector assembly 102.

In the depicted embodiment, the electrode connector 200 may define a channel 206. The channel 206 may extend from the cavity 104 defined in the reflector assembly 102 to a dielectric layer end 208 of the protrusion 202. The channel 206 may be tapered in some embodiments. For example, the channel 206 may include a larger cross-sectional area where the channel 206 meets the cavity 104 than at the dielectric layer end 208.

In some embodiments, the cavity surface 154 may join with an inner channel surface 225 of the channel 206. The cavity surface 154 and the inner channel surface 225 may be electrically conductive. For example, the cavity surface 154, the inner channel surface 225, or some portion thereof may be composed of electrically conductive material.

Additionally or alternatively, an electrically conductive material 212 may be applied to the cavity surface 154, the inner channel surface 225, or some portions thereof. The electrically conductive material 212 may, in some embodiments, also be the reflective material forming the concave reflecting surface discussed above. For example, the reflector assembly 102 may be at least partially composed of an electrical insulator. The electrically conductive material 212 may coat or otherwise be applied to the electrical insulator.

In embodiments in which the channel 206 is tapered and the reflector assembly 102 and/or the protrusion 202 is composed of the electrical insulator, the tapering of the channel 206 may, inter alia, provide advantages when applying the electrically conductive material 212.

With specific reference to FIG. 2B, a bottom view of the electrode connector 200 is depicted. Specifically, the dielectric layer end 208 of the protrusion 202 is depicted in FIG. 2B. In the depicted embodiment, the dielectric layer 110 may include a trace 210. The trace 210 may extend at least partially across the connector aperture 114. The channel 206 may be configured to receive at least a portion of the trace 210 such that the trace 210 contacts the electrically conductive material 212 applied to the inner channel surface 225, which electrically conductive material 212 may also be applied to the cavity surface 154. The trace 210 may be soldered to the dielectric layer end 208 of the protrusion 202. In embodiments omitting the electrically conductive material 212, the trace 210 may contact the electrically conductive inner channel surface 225 and/or cavity surface 154.

With combined reference to FIGS. 1-2B, electrical signals may be communicated from the trace 210 to the second semiconductor 116 via the electrode connector 200. Specifically, the electrical signal on the trace 210 may be communicated from the trace 210 to the electrically conductive material 212, which may communicate the electrical signal to the second semiconductor 116 disposed in the cavity 104.

FIG. 2C is a diagram of another example embodiment of the electrode connector 200 that may be included in the light-emissive device 100 of FIG. 1, arranged in accordance with at least some embodiments described herein. The electrode connector 200 in FIG. 2C is depicted relative to the dielectric layer 110. Specifically, the electrode connector 200 as depicted in FIG. 2C is received in the connector aperture 114 of the dielectric layer 110.

The electrode connector 200 depicted in FIG. 2C may include a second electrode pin 250. The second electrode pin 250 may include, for example, a cylindrical pin. The second electrode pin 250 may be composed of an electrically conductive material and/or may be coated with an electrically conductive material.

In some embodiments in which the electrode connector 200 includes the second electrode pin 250, the reflector assembly 102 may include a second pin opening 254. The second pin opening 254 may substantially align with the connector aperture 114. The second electrode pin 250 may be received in the second pin opening 254 and the connector aperture 114 and may extend into the cavity 104. Additionally, the reflector assembly 102 may include the cavity surface 154. The cavity surface 154 may be conductive or the cavity surface 154 may be coated with an electrically conductive material 256. The second electrode pin 250 may be electrically coupled to the cavity surface 154 or to the electrically conductive material 256.

For example, the reflector assembly 102 may be composed of a flexible polymer that may be an electrical insulator. The electrically conductive material 256 may be applied to the cavity surface 154. The second electrode pin 250 may be electrically coupled to a portion of the electrically conductive material 256. With combined reference to FIGS. 1 and 2C, the electrically conductive material 256 may be adjacent to the second semiconductor 116 disposed in the cavity 104. Additionally or alternatively, the second electrode pin 250 may be at least partially positioned in the second semiconductor 116. Accordingly, the electrical signal may be communicated from the second electrode pin 250 to the electrically conductive material 256. The electrical signal may then be communicated to the second semiconductor 116 from a portion of the electrically conductive material 256 and/or the second electrode pin 250.

In some embodiments, the dielectric layer 110 may include or have formed therein or thereon a trace (not shown in FIG. 2C). The trace may be electrically coupled to the second electrode pin 250. The trace of the dielectric layer 110 may thus provide the electrical signal to the second electrode pin 250, which may then be communicated to the second semiconductor 116.

FIGS. 3A and 3B are diagrams of an example embodiment of the electrode pin 300 that may be included in the light-emissive device 100 of FIG. 1, arranged in accordance with at least some embodiments described herein. Specifically, in FIG. 3A, the electrode pin 300 is depicted without the first semiconductor and in FIG. 3B the electrode pin 300 is depicted with the first semiconductor 144. The electrode pin 300 may include a head 302 and a shaft 304. The head 302, and in particular, an outer surface 308, may be configured to receive and shape the first semiconductor 144. For example, the outer surface 308 may generally include a top surface of the head 302. The outer surface 308 may be domed or may be substantially flat. When the first semiconductor 144 is deposited on the head 302, the first semiconductor 144 may conform to the outer surface 308. In some embodiments in which the outer surface 308 is domed, the shape of the first semiconductor 144 may also be substantially dome-shaped as depicted in FIG. 3B.

With combined reference to FIGS. 1 and 3B, the dome-shape of the head 302 and/or the first semiconductor 144 may increase an area of the interface 126 over similar configurations having the outer surface 308 that is substantially flat. For example, in embodiments in which the head 302 is substantially flat, the area of the interface 126 may be about equal to an area of a disc. Specifically, the area of the interface 126 may be about equal to $\pi r^2$, where r represents the radius of the outer surface 308 of the head 302.

In embodiments in which the head 302 is dome-shaped, assuming the dome-shape is substantially spherical, the area of the interface 126 may be about equal to $2\pi Rh$, where R represents the radius of a sphere that defines the dome and h represents the a height from a plane defined at a circumference of the outer surface 308 to point 310 furthest from the plane.

Additionally or alternatively, in some embodiments, the area of the interface 126 may be increased by the first semiconductor 144 coating the head 302 in a dome shape. For example, surface tension of the first semiconductor 144 may at least partially shape the first semiconductor 144 as a dome. The area of the interface 126 may correspond to an amount of the light 142 emitted by the light-emissive device 100.

Referring back to FIGS. 3A and 3B, the shaft 304 may extend from the head 302. In the depicted embodiment, the shaft 304 may extend in the negative y direction away from the head 302. The shaft 304, or some portion thereof or other portions of the electrode pin 300, may be coated with an insulating coating 306 such as an insulating polymer. The insulating coating 306 may reduce communication of electrical signals between the shaft 304 and a structure or semiconductor adjacent to the insulating coating 306. For example, the shaft 304 and/or underside of the head 302 may be insulated to prevent electrical contact with the second semiconductor.

The head 302 may comprise a same material as the shaft 304, or may comprise a different material. In some embodiments, the head 302 may comprise, for example as a coating and/or a metal layer. The head 302 may have a rounded convex surface directed towards the light opening 106. For example, the head 302 may include a central portion closer to the light opening 106 than a peripheral portion. In some embodiments, the head 302 may be coated with a hole or electron blocking layer. The hole or electron blocking layer may prevent or reduce degradation of a substantially adjacent first semiconductor (e.g., 144 of FIG. 1). The head 302 may include an appreciably greater diameter than the shaft 304. In some embodiments, the head 302 may have a generally spheroidal shape. In some embodiments, the head 302 may have a generally plano-plano (e.g. flat disk) or plano-convex form, the planar portion being attached to the shaft 304. In some embodiments, the head 302 may have a generally concave surface directed towards the light opening, where the convex surface may appreciably contribute to focusing of light output by a light-emissive device implementing the electrode pin 300.

With combined reference to FIGS. 1, 3A, and 3B, the electrode pin 300 may be at least partially positioned in the cavity 104. Specifically, in some embodiments, the shaft 304 may extend through the electrode pin opening 108 and the pin aperture 112 of the reflector assembly 102. For example, a portion of the shaft 304 and the head 302 may be positioned in the cavity 104. The insulating coating 306 may cover the portion of the shaft 304 surrounded by the second semiconductor 116. The insulating coating 306 may reduce communication of the electrical signals from the electrode pin 300 to the second semiconductor 116. Additionally, the first semiconductor 144 may form the interface 126 with the second semiconductor 116.

Figure 4:
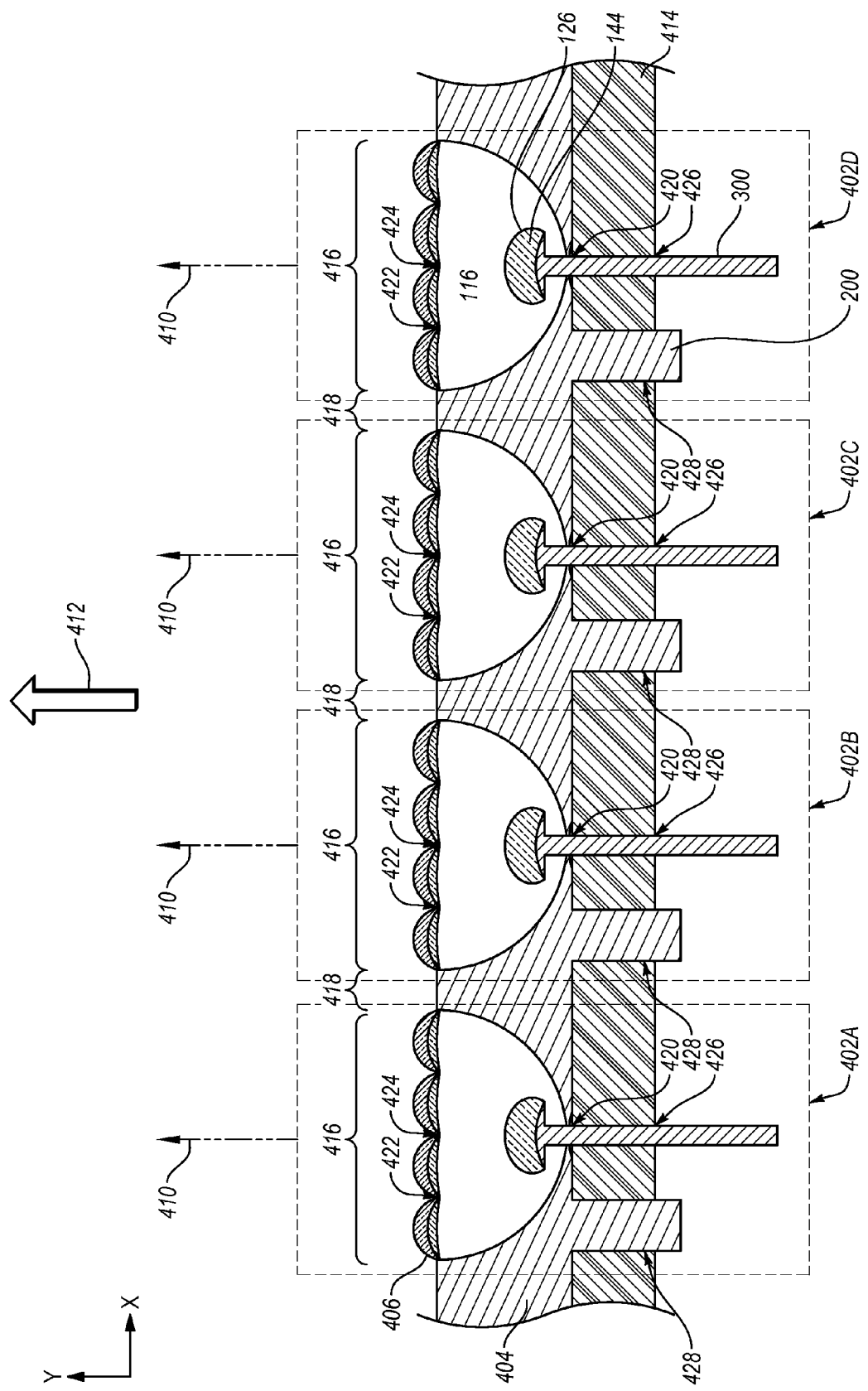
FIG. 4 is a diagram of a light-emissive display (display)

In some embodiments, the electrode pin 300 may not include discernible head 302, and the first semiconductor 144 may be disposed around some or all of the electrode pin portion located within the reflective cavity. FIG. 4 is a diagram of a light-emissive display (display) 400, arranged in accordance with at least some embodiments described herein. The display 400 may include multiple light-emissive devices 402A-402D. Specifically, the multiple light-emissive devices 402A-402D may include a first light-emissive device 402A, a second light-emissive device 402B, a third light-emissive device 402C, and a fourth light-emissive device 402D, each of which are denoted by reference numbers and a dashed rectangular outline in FIG. 4. One or more of the multiple light-emissive devices 402A-402D may be configured to emit light 410 in a target direction, which is generally indicated by an arrow 412 in FIG. 4. The light 410 emitted by one or more of the multiple light-emissive devices 402A-402D may combine to illuminate a target surface or may be used as a light source or a curing source, for instance.

In some non-illustrated embodiments, the display 400 includes multiple reflector assemblies. The reflector assemblies may be arranged in an array. One or more light emissive elements of the display 400 may be configured as a light-emissive device described elsewhere.

The display 400 may include a display reflector assembly 404. The display reflector assembly 404 may be similar to the reflector assembly 102 described with reference to FIG. 1. For example, the display reflector assembly 404 may be composed of a polymer and/or a metal. Additionally, the display reflector assembly 404, or some portion thereof, may be coated with an electrically conductive material and/or a reflective material.

The display reflector assembly 404 may be configured for the multiple light-emissive devices 402A-402D. For example, the display reflector assembly 404 may define multiple electrode pin openings 420. One or more of the multiple electrode pin openings 420 may be substantially similar to the electrode pin opening 108 of FIG. 1. The display reflector assembly 404 may define multiple cavities 422. One or more of the multiple cavities 422 may be substantially similar to the cavity 104 of FIG. 1. One or more of the multiple cavities 422 may be coated with an electrically conductive material and/or a reflective material, which may form reflecting concave surfaces. In some embodiments, the display reflector assembly 404 may define the multiple cavities 422, which may be arranged in a two-dimensional array.

The display reflector assembly 404 may define multiple light openings 424. One or more of the multiple light openings 424 may be substantially similar to the light opening 106 of FIG. 1.

Additionally, the display 400 may include a display lens sheet 406 and a display dielectric layer 414. The display lens sheet 406 may be similar to the lens sheet 120 described with reference to FIG. 1. For example, the display lens sheet 406 may include a multi-layer array that includes multiple mini lenses. The display lens sheet 406 may include one or more sets of mini lenses 416 and one or more intermediate sections 418. Each set of mini lenses 416 may be positioned over a corresponding one of the multiple light-emissive devices 402A-402D, for example. In addition, the intermediate sections 418 may be positioned between the sets of mini lenses 416 and/or between adjacent parts of the multiple light-emissive devices 402A-402D.

The display dielectric layer 414 may be similar to the dielectric layer 110 described with reference to FIG. 1. For example, the display dielectric layer 414 may include a PCB and may include one or more traces. The display dielectric layer 414 may be configured for the multiple light-emissive devices 402A-402D. For example, the display dielectric layer 414 may define multiple connector apertures 428. One or more of the multiple connector apertures 428 may be substantially similar to the connector aperture 114 of FIG. 1. The display dielectric layer 414 may define multiple electrode pin apertures 426. One or more of the electrode pin apertures 426 may be similar to the pin aperture 112 of FIG. 1. The display dielectric layer 414 may include multiple traces (not shown in FIG. 4) that may be configured to contact or otherwise electrically interface components of one or more of the multiple light-emissive devices 402A-402D. The display dielectric layer 414 may be integrated with the display reflector assembly 404, which may facilitate integrations of the display 400 into larger systems.

One or more of the multiple light-emissive devices 402A-402D may be similar to the light-emissive device 100 described above with reference to FIG. 1. For example, one or more of the multiple light-emissive devices 402A-402D may include an electrode pin, such as the electrode pin 300, that is at least partially positioned in one of the multiple cavities 422 and that includes the configuration or variations thereof described herein. For instance, in FIG. 4, the electrode pin 300, the first semiconductor 144, the second semiconductor 116, the interface 126, and the electrode connector 200 are labeled for the fourth light-emissive device 402D. However, the first light-emissive device 402A, the second light-emissive device 402B, the third light-emissive device 402C, or some combination thereof may similarly include an electrode pin, a first semiconductor, a second semiconductor, an emissive interface, and an electrode connector.

In some embodiments, the multiple light-emissive devices 402A-402D may be multiplexed by electrical signals applied to each of the multiple light-emissive devices 402A-402D. For example, the electrical signals may be applied between the electrode pins 300 and the electrode connectors 200 of each of the multiple light-emissive devices 402A-402D.

The display 400 depicted in FIG. 4 includes four light-emissive devices 402A-402D. More generally, in these and other embodiments, the display 400 may include more than four light-emissive devices or fewer than four light-emissive devices, any one or more of which may be similar to the light-emissive device 100 described with reference to FIG. 1.

Additionally, one or more subsets of the multiple light-emissive devices 402A-402D included in the display 400 may include a same first semiconductor 144 and a same second semiconductor 116. Moreover, one or more subsets of the multiple light-emissive devices 402A-402D may include a different first semiconductor 144 and/or a different second semiconductor 116 from any other subset of the multiple light-emissive devices 402A-402D. Furthermore, in some embodiments of the display 400, one or more subsets of the multiple light-emissive devices 402A-402D may include a protrusion, such as the protrusion 202 of FIGS. 2A and 2B, while one or more of the multiple light-emissive devices 402A-402D may include a second electrode pin, such as the second electrode pin 250 of FIG. 2C.

Figure 5B:
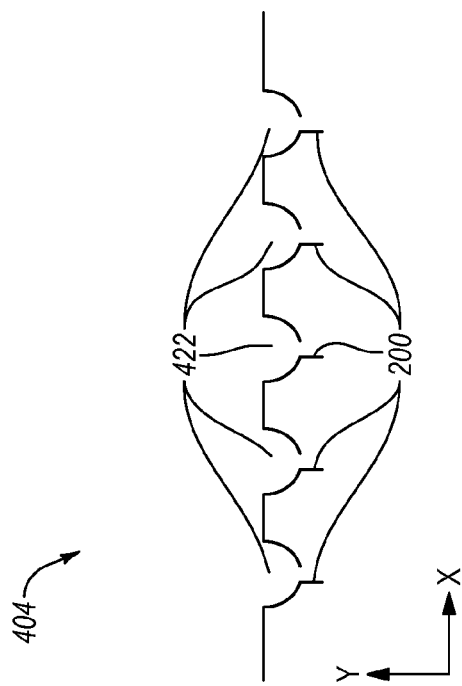
FIGS. 5A and 5B are diagrams of an example embodiment of a display reflector assembly that may be included in the display of FIG. 4.
Figure 5A:
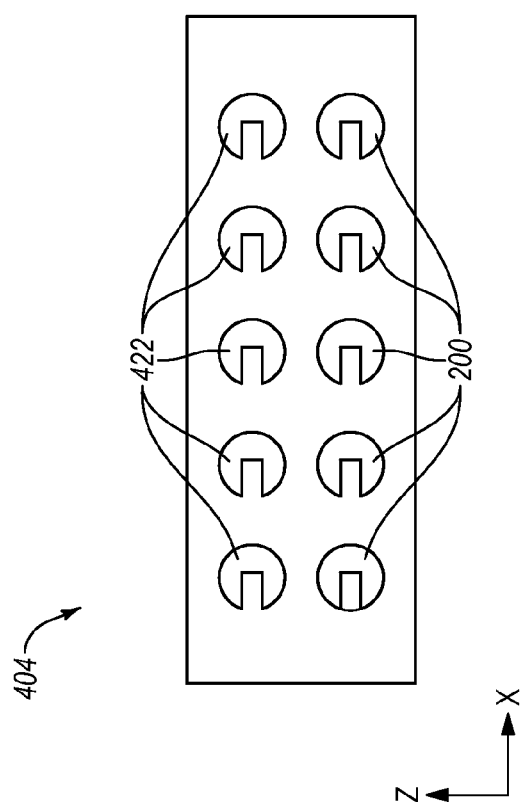

FIGS. 5A and 5B are diagrams of an example embodiment of the display reflector assembly 404 that may be included in the display 400 of FIG. 4, arranged in accordance with at least some embodiments described herein. FIG. 5A depicts a top view of the display reflector assembly 404 before being configured for multiple light-emissive devices (e.g., the multiple light-emissive devices 402A-402D of FIG. 4). FIG. 5B depicts a sectional view of the display reflector assembly 404 after being configured for the multiple light-emissive devices.

With reference to FIG. 5A, the display reflector assembly 404 may generally include a stamped sheet. For example, the display reflector assembly 404 may include a stamped sheet of metal. Prior to configuring the display reflector assembly 404, the multiple cavities 422 and/or the electrode connectors 200 may be substantially flat with other portions of the stamped sheet. The multiple cavities 422 and/or the electrode connectors 200 may be cut or otherwise formed in a stamping process. As illustrated in FIG. 5A, the display reflector assembly 404 and thus a display (e.g., the display 400) that may include the display reflector assembly 404 of FIGS. 5A and 5B may include one or more rows and one or more columns of light-emissive devices (e.g., the light-emissive device 100 of FIG. 1 and/or the multiple light-emissive devices 402A-402D of FIG. 4).

With reference to FIG. 5B, when configured, the multiple cavities 422 may include a parabolic or semicircular cross section and/or the electrode connectors 200 may generally extend from the multiple cavities 422. In some embodiments, the display reflector assembly 404 may be composed of a conductive material such as a metal. Accordingly, portions of the stamped sheet that define the multiple cavities 422 and the electrode connectors 200 may be electrically conductive.

Figure 6:
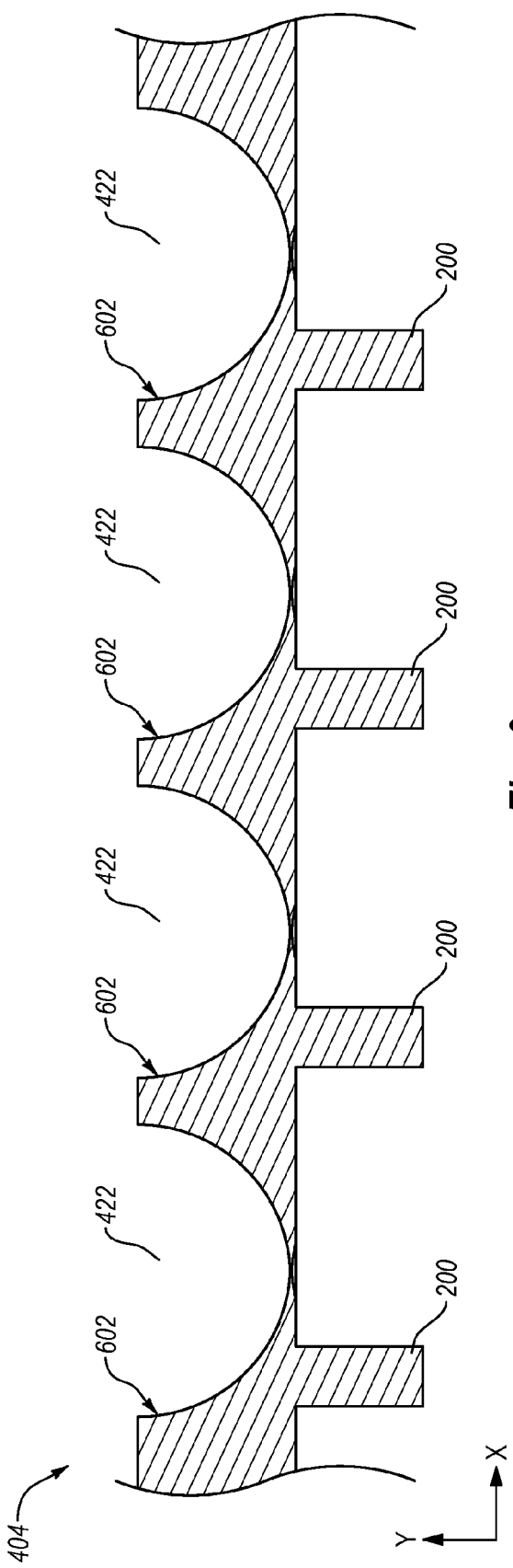
FIG. 6 is a diagram of another example embodiment of a display reflector assembly that may be included in the display of FIG. 4.

FIG. 6 is a diagram of another example embodiment of the display reflector assembly 404 that may be included in the display 400 of FIG. 4, arranged in accordance with at least some embodiments described herein. FIG. 6 depicts a sectional view of the display reflector assembly 404 configured for multiple light-emissive devices (e.g., the multiple light-emissive devices 402A-402D of FIG. 4). The display reflector assembly 404 may generally include a molded structure. For example, the display reflector assembly 404 may include a plastic or flexible polymer molded structure. The multiple cavities 422 and/or the electrode connectors 200 may be molded into a single structure in some embodiments. Cavity surfaces 602 and/or of one or more of the multiple cavities 422 may be coated with a reflective material and/or an electrically conductive material as discussed with reference to FIGS. 1-2C. Additionally, one or more electrode connectors 200 may include the protrusions 202 discussed with reference to FIGS. 2A and 2B and one or more electrode connectors 200 may include the second electrode pin 250 discussed with reference to FIG. 2C.

The display reflector assembly 404 depicted in FIG. 6 includes four cavities 422 and four electrode connectors 200. More generally, the display reflector assembly 404 may include any number of cavities and electrode connectors, including four cavities and/or electrode connectors, more than four cavities and/or electrode connectors, or fewer than four cavities and/or electrode connectors.

Figure 7:
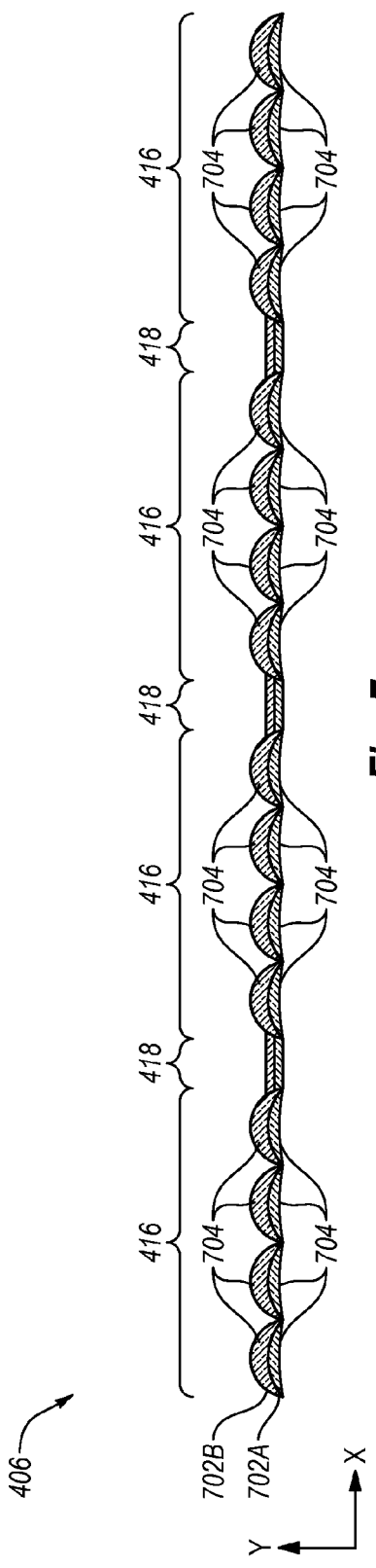
FIG. 7 is a diagram of an example embodiment of a display lens sheet that may be included in the display of FIG. 4.

FIG. 7 is a diagram of an example embodiment of the display lens sheet 406 that may be included in the display 400 of FIG. 4, arranged in accordance with at least some embodiments described herein. With combined reference to FIGS. 4 and 7 the display lens sheet 406 is depicted separate from the display 400. The display lens sheet 406 may be formed layer by layer directly on the display 400 and/or may be formed in its entirety prior to incorporation into the display 400. FIG. 7 depicts a sectional view of the display lens sheet 406 configured for the light-emissive devices 402A-402D. The display lens sheet 406 may generally be configured to focus and/or control an angular distribution of the light 410 emitted by the multiple light-emissive devices 402A-402D. The display lens sheet 406 may include a multi-layer array. In some embodiments, the different layers in the multi-layer array may be composed of different materials, which may have differing refractive indexes.

The display lens sheet 406 depicted in FIG. 7 includes a dual-layer array similar to the lens sheet 120 of FIG. 1. Specifically, the display lens sheet 406 may include a first layer 702A and a second layer 702B. The second layer 702B may be positioned on the first layer 702A. In some embodiments, the first layer 702A and/or the second layer 702B may be fabricated by injection molding or depositing materials in a mold. For example, a second material from which the second layer 702B may be composed may be deposited in a fluid state into a mold. A first material from which the first layer 702A may be composed may then be deposited on the second material. The first and second material may be cured or otherwise processed to form the display lens sheet 406.

One or more mini lenses 704 may be formed in the first layer 702A and/or the second layer 702B. The mini lenses 704 may be formed in portions of the display lens sheet 406 that may be positioned above the multiple light-emissive devices 402A-402D of FIG. 4 and may be arranged into the one or more sets of mini lenses 416. Between the sets of mini lenses 416 may be the intermediate sections 418. The intermediate sections 418 may not include any of the mini lenses 704. The first layer 702A and the second layer 702B in FIG. 7 include four mini lenses in each of the sets of mini lenses 416. More generally, in these and other embodiments the sets of mini lenses 416 may include more than four mini lenses 704 or three or fewer mini lenses 704. Additionally, in some embodiments, the mini lenses 704 in the first layer 702A and/or the second layer 702B may be different sizes, thicknesses, and/or curvatures. Additionally or alternatively, the mini lenses 704 may differ in size, thickness, and/or curvature between the sets of mini lenses 416.

As in the lens sheet 120, the display lens sheet 406 may include an array in which the first material and the second material are arranged in order of decreasing refractive index. For instance, the first material may have a first refractive index that may be greater than a second refractive index of the second material. Accordingly, refractive indexes may decrease from the first layer 702A to the second layer 702B.

Alternately or additionally, some or the entire display lens sheet 406 may include a monolithic structure. The monolithic structure may have a single refractive index or a refractive index gradient. For example, the refractive index of the monolithic structure may decrease in a positive y direction. Alternatively or additionally, some or all of the display lens sheet 406 may include three or more layers, each of which may form one or more mini lenses 704 similar to those described above.

The light-emissive device 100 of FIG. 1 and/or the display 400 of FIG. 4 may increase the ease with which the interface 126 is produced in comparison to some devices fabricated from solid semiconductor structures. Additionally, the light-emissive device 100 of FIG. 1 and/or the display 400 of FIG. 4 may increase the ease with which one or more examples of the light-emissive device 100 are incorporated into the display 400 in comparison to some devices fabricated from solid semiconductor structures.

Generally, solid flat semiconductor devices fabricated from solid semiconductor structures may be manufactured using wafers. The wafers may be produced in a high pressure and high temperature environment using liquid encapsulation. The wafers may then be cut and cleaned. Epitaxial layers and metallic contacts may then be added to the wafers. Additionally, to use the similar devices fabricated from solid structures in a lighting array, each of the similar devices may be secured within the lighting array and sealed in plastic.

In contrast, the light-emissive device 100 and/or the display 400 may be fabricated in the reflector assembly 102 or in the display reflector assembly 404, respectively. The first semiconductor 144 and/or the second semiconductor 116 may be liquid during the manufacturing or a portion thereof. Additionally, the first semiconductor 144 and/or the second semiconductor 116 may be electrically coupled using the electrode pin 300, the electrically conductive material 212, the electrode connector 200, the second electrode pin 250, or some combination thereof. Some additional details of methods of manufacturing light-emissive devices 100 or displays 400 are provided with reference to FIGS. 8 and 9.

Figure 8:
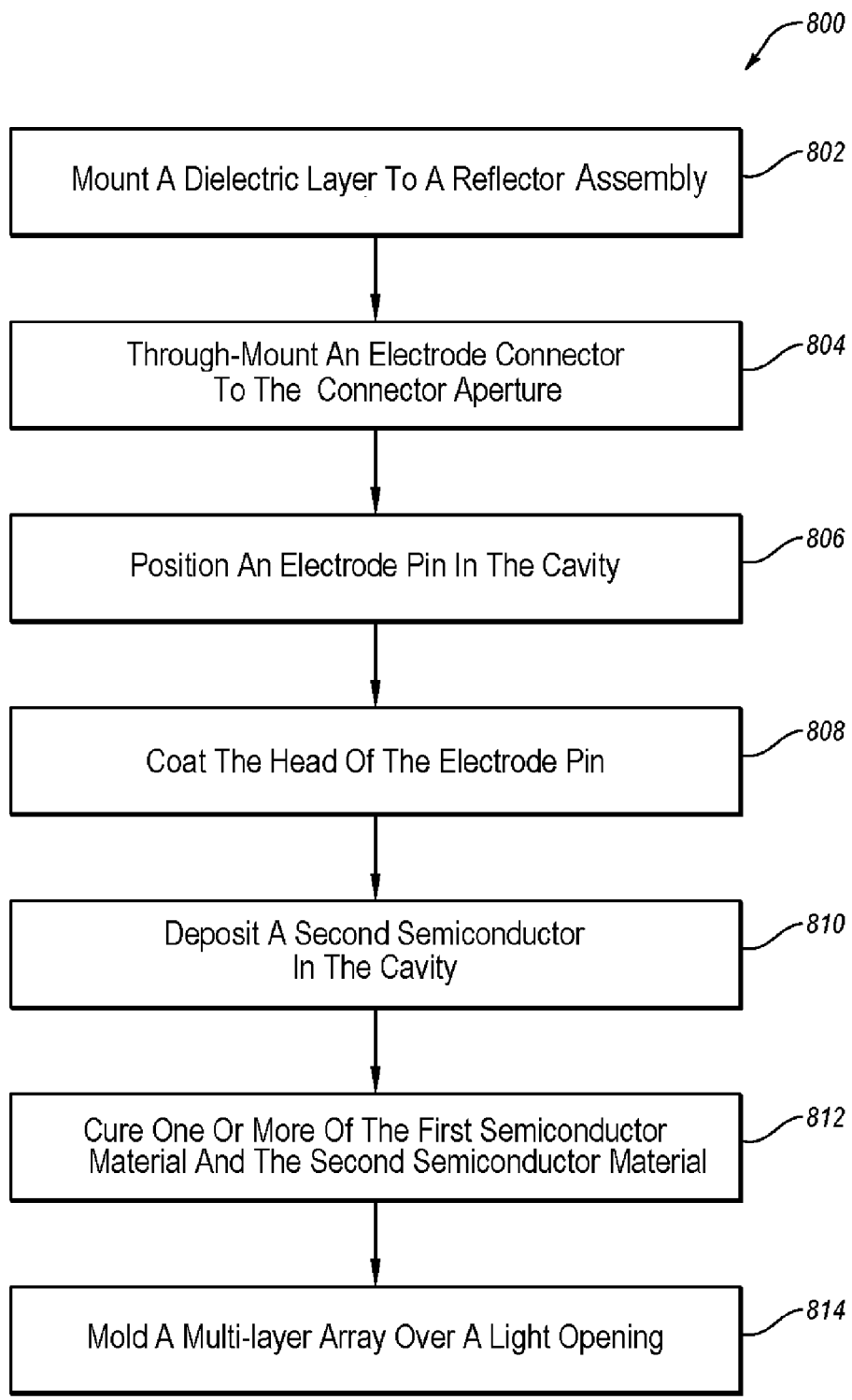
FIG. 8 shows a flow diagram of an example method of manufacturing a light-emissive device.

FIG. 8 shows a flow diagram of an example method 800 of manufacturing a light-emissive device, arranged in accordance with at least some embodiments described herein. The method 800 may be performed, for example, to manufacture the light-emissive device 100 of FIG. 1 and/or the display 400 of FIG. 4. Although illustrated as discrete blocks, various blocks may be divided into additional blocks, supplemented with additional blocks, combined into fewer blocks, or eliminated, depending on the particular implementation.

The method 800 may begin at block 802. At block 802 ("Mount A Dielectric Layer To A Reflector Assembly"), a dielectric layer may be mounted to a reflector assembly. The dielectric layer may define a pin aperture and a connector aperture. Additionally, the reflector assembly may define a cavity. For example, referring to FIG. 1, the dielectric layer 110 may be mounted to the reflector assembly 102.

In some embodiments, the reflector assembly may be stamped from a sheet of material and the cavity and the electrode connector may be pressed into the stamped reflector assembly. For example, referring to FIGS. 5A and 5B, the display reflector assembly 404 may be stamped from a sheet of material and the multiple cavities 422 and the electrode connector 200 may be pressed into the display reflector assembly 404.

At block 804 ("Through-Mount An Electrode Connector To The Connector Aperture"), an electrode connector may be through-mounted to the connector aperture. For example, referring to FIG. 1, the electrode connector 200 may be through-mounted to the connector aperture 114.

In some embodiments, the reflector assembly may be molded. Additionally, in these and other embodiments, the electrode connector may be molded as a protrusion extending from the reflector assembly. The protrusion may be molded with a channel extending from the cavity to a dielectric layer end of the protrusion. A cavity surface of the cavity and an inner channel surface of the channel may be coated with a conductive material. A trace of the dielectric layer may be positioned into the channel at the dielectric layer end such that the trace contacts the inner channel surface. For example, referring to FIGS. 2A and 2B, the reflector assembly 102 may be molded. The electrode connector 200 may be molded to include the protrusion 202 extending from the reflector assembly 102. The protrusion 202 may be molded with the channel 206 that may extend from the cavity 104 to the dielectric layer end 208. The cavity surface 154 and/or the inner channel surface 225 may be coated with the electrically conductive material 212. The trace 210 of the dielectric layer may be positioned into the channel 206 at the dielectric layer end 208 such that the trace 210 contacts the inner channel surface 225.

In some embodiments, the electrode connector may include a second electrode pin. In these and other embodiments, the method 800 may include coating the cavity surface with a conductive material, electrically coupling the cavity surface to the second electrode pin, at least partially positioning the second electrode pin in the second semiconductor, and through-mounting the second electrode pin to the electrode connector aperture.

At block 806 ("Position An Electrode Pin In The Cavity"), an electrode pin may be at least partially positioned in the cavity. The positioning of the electrode pin may include positioning a shaft of the electrode pin within an electrode pin hole defined in the reflector assembly. Additionally, the positioning of the electrode pin may include positioning a head of the electrode pin within the cavity and through-mounting the shaft of the electrode pin to the electrode pin aperture.

At block 808 ("Coat The Head Of The Electrode Pin"), the head of the electrode pin may be coated with a first semiconductor. For example, referring to FIG. 3B, the head 302 of the electrode pin 300 may be coated with the first semiconductor 144. At block 810 ("Deposit A Second Semiconductor In The Cavity"), a second semiconductor may be deposited in the cavity. In some embodiments, the second semiconductor may be deposited in the cavity such that the second semiconductor surrounds the first semiconductor. Additionally, the second semiconductor may be deposited such that the second semiconductor may be electrically coupled to the electrode connector. For example, referring to FIG. 1, the second semiconductor 116 may be deposited in the cavity 104. In the embodiment depicted in FIG. 1, the second semiconductor 116 may surround the first semiconductor 144 coating a portion of the electrode pin 300.

At block 812 ("Cure One Or More Of The First Semiconductor Material And The Second Semiconductor Material"), one or more of the first semiconductor material and the second semiconductor material may be cured. For example, referring to FIG. 1, the first semiconductor 144 and the second semiconductor 116 may be cured.

At block 814 ("Mold A Multi-layer Array Over A Light Opening") defined in the reflector plate, a multi-layer array may be molded over a light opening. The light opening may be defined by the reflector assembly. The multi-layer array may include mini lenses having increasingly-lower or decreasing refractive indexes. In some embodiments, the molding of the multi-layer array may include placing mini lenses onto a liquid precursor and curing the mini lenses with the liquid precursor.

For example, referring to FIG. 1 the lens sheet 120 may be a dual-layer array. The lens sheet 120 may be molded over the light opening 106 defined by the reflector assembly 102. The lens sheet 120 may include the first mini lens 122A and/or the second mini lens 122B. The first mini lens 122A may be composed of the first material which may have a higher refractive index than the second material of which the second mini lens 122B may be composed.

One skilled in the art will appreciate that, for this and other processes and methods disclosed herein, the functions performed in the processes and methods may be implemented in differing order. Furthermore, the outlined operations are only provided as examples, and some of the operations may be optional, combined into fewer operations, supplemented with other operations, or expanded into additional operations without detracting from the essence of the disclosed embodiments.

Figure 9:
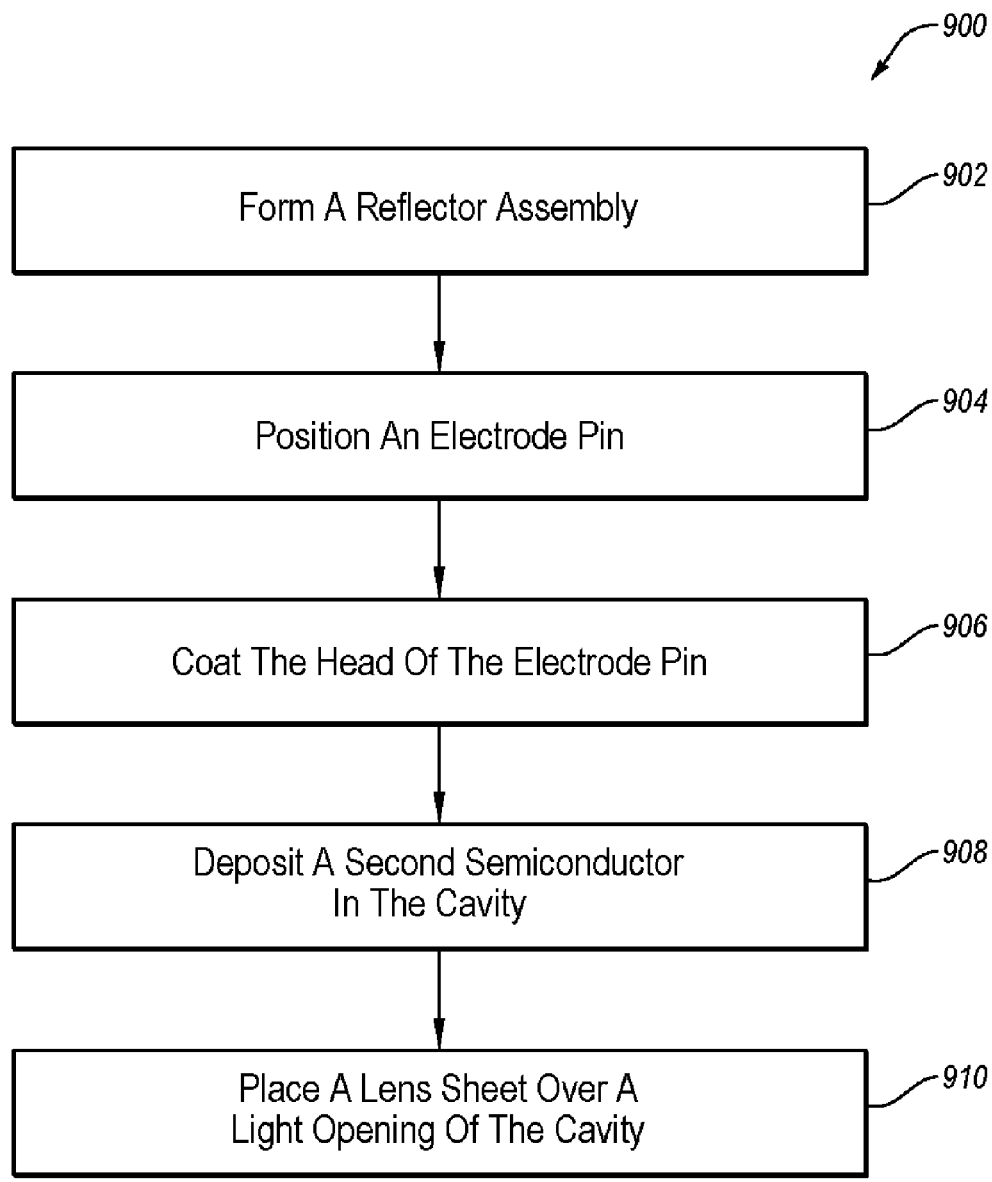
FIG. 9 shows a flow diagram of an example method of fabricating a light-emissive device, all arranged in accordance with at least some embodiments described herein.

FIG. 9 shows a flow diagram of an example method 900 of fabricating a light-emissive device, arranged in accordance with at least some embodiments described herein. The method 900 may be performed, for example, to manufacture the light-emissive device 100 of FIG. 1 and/or the display 400 of FIG. 4. Although illustrated as discrete blocks, various blocks may be divided into additional blocks, supplemented with additional blocks, combined into fewer blocks, or eliminated, depending on the particular implementation.

The method 900 may begin at block 902. At block 902 ("Form A Reflector Assembly"), a reflector assembly may be formed. In some embodiments, the reflector assembly may include a concave reflecting surface. The concave reflecting surface may partially surround the cavity. For example, referring to FIG. 1, the cavity 104 may include the cavity surface 154. A portion of the cavity surface 154 may be coated with a reflective material, which may make the concave reflecting surface.

At block 904 ("Position An Electrode Pin"), an electrode pin may be positioned. The positioning of the electrode pin may include positioning a shaft and a head so that the head may be located in the cavity and the shaft extends through an electrode pin opening in the reflector assembly. For example, referring to FIGS. 1 and 3B, the electrode pin 300 may be positioned in the cavity 104. Positioning the electrode pin 300 may include positioning the shaft 304 and the head 302 so that the head 302 may be located in the cavity 104 and the shaft 304 may extend through the electrode pin opening 108 in the reflector assembly 102.

At block 906 ("Coat The Head Of The Electrode Pin"), the head of the electrode pin may be coated with a first semiconductor. For example, referring to FIG. 3B, the head 302 may be coated with the first semiconductor 144.

At block 908 ("Deposit A Second Semiconductor In The Cavity"), a second semiconductor may be deposited in the cavity. The second semiconductor may form an emissive interface with the first semiconductor. In some embodiments, depositing the second semiconductor in the cavity may include depositing a liquid precursor of the second semiconductor in the cavity. In some embodiments, depositing the second semiconductor in the cavity may include introducing a liquid precursor into the cavity and curing the liquid precursor to form the second semiconductor. For example, referring to FIG. 1, the second semiconductor 116 in a fluid state may be deposited in the cavity 104. The second semiconductor 116 may form the interface 126 with the first semiconductor 144.

At block 910 ("Place A Lens Sheet Over A Light Opening Of The Cavity"), a lens sheet may be placed over a light opening of the cavity. For example, referring to FIG. 1, the lens sheet 120 may be placed over the light opening 106 of the cavity 104.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into sub ranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light-emissive device comprising:
a reflector assembly that defines a cavity, a light opening, and an electrode pin opening;
a dielectric layer positioned adjacent to the reflector assembly, wherein the dielectric layer defines an electrode pin aperture and an electrode connector aperture;
an electrode pin that includes a head and a shaft, wherein the head is positioned in the cavity and coated with a first semiconductor and the shaft is at least partially positioned in the electrode pin opening and through-mounted to the electrode pin aperture;
a second semiconductor disposed in the cavity, wherein the second semiconductor surrounds the first semiconductor; and
an electrode connector electrically coupled to the second semiconductor and through-mounted to the electrode connector aperture.

2. The light-emissive device of claim 1, wherein the cavity includes a concave parabolic cup having a cavity surface, wherein at least a portion of the cavity surface is coated with an electrically conductive and reflective material.

3. The light-emissive device of claim 1, wherein:
the shaft is at least partially coated with an insulating coating; and
the head is substantially dome-shaped.

4. The light-emissive device of claim 1, wherein:
the electrode connector includes a protrusion extending from the reflector assembly;
the protrusion includes a dielectric layer end and defines a channel extending from the cavity to the dielectric layer end;
the channel is configured to receive a trace of the dielectric layer at the dielectric layer end;
the reflector assembly includes an insulator material;
an inner channel surface of the channel and a cavity surface of the cavity are conductive; and
the channel is configured to receive the trace such that the trace contacts the conductive inner channel surface.

5. The light-emissive device of claim 1, wherein:
the electrode connector includes a second electrode pin that is at least partially positioned in the second semiconductor;
the reflector assembly includes a cavity surface that is conductive; and
the cavity surface is electrically coupled to the second electrode pin.

6. The light-emissive device of claim 1, further comprising a lens sheet positioned over the light opening, the lens sheet including a multi-layer array of curved mini lenses including materials having different refractive indexes.

7. A light-emissive display, comprising two or more of the light-emissive device of claim 1 multiplexed using electrical signals applied between the electrode pin and the electrode connector of each of the light-emissive devices.

8. The light-emissive device of claim 1, further comprising a secondary emissive layer positioned between the first semiconductor and the second semiconductor.

9. A light-emissive device, comprising:
a reflector assembly that includes an electrically conducting portion and that defines an electrode pin opening and a cavity having a light opening;
an electrode pin that includes a head and a shaft, wherein the head is positioned in the cavity and the shaft extends through the electrode pin opening;
a first semiconductor located on the head of the electrode pin;
a second semiconductor that at least partially fills the cavity, wherein the second semiconductor forms an emissive interface with the first semiconductor and is adjacent to at least a portion of the electrically conducting portion; and
an electrical connector that is electrically coupled to the second semiconductor and to the electrically conducting portion.

10. The light-emissive device of claim 9, wherein the light-emissive device is configured such that a unidirectional electrical signal applied between the electrical connector and the electrode pin induces light emission from the emissive interface.

11. The light-emissive device of claim 9, wherein the electrode pin is configured such that a portion of the shaft is located within the cavity.

12. The light-emissive device of claim 9, wherein:
the head has a convex outer surface; and
a layer of the first semiconductor conforms to the convex outer surface.

13. The light-emissive device of claim 9, wherein one or more of:
- the first semiconductor includes an oxadiazole molecule and a hole blocker material and the second semiconductor includes one or more of poly(p-phenylene vinylene), poly(9,9-dioctylfluorene-co-N-(4-(3-methylpropyl)) diphenylamine), polyfluorene, and poly(3,4-ethylene-dioxythiophene)-poly(styrenesulfonate) ("PEDOT-PSS");
- the first semiconductor is a p-type semiconductor and the second semiconductor is an n-type semiconductor;
- the first semiconductor is a first organic semiconductor and the second semiconductor is a second organic semiconductor;
- the first semiconductor is a hole transport material and the second semiconductor is an electron transport material; and
- the first semiconductor and the second semiconductor each comprise a molecular semiconductor or a polymeric semiconductor.

14. The light-emissive device of claim 9, further comprising a lens sheet positioned over the light opening, wherein the lens sheet includes a convex lens.

15. The light-emissive device of claim 9, wherein the reflector assembly includes a concave reflecting surface, the concave reflecting surface in part defining the cavity.

16. The light-emissive device of claim 15, wherein the concave reflecting surface includes an electrical conductor that is electrically coupled to the second semiconductor.

17. A method of fabricating a light-emissive device, the method comprising:
- forming a reflector assembly that defines a light opening, an electrode pin opening, and a cavity that includes a concave reflective surface that partially coats the cavity;
- positioning a dielectric layer adjacent to the reflector assembly, wherein the dielectric layer defines an electrode pin aperture and an electrode connector aperture;
- coating a head of an electrode pin with a first semiconductor;
- positioning the electrode pin that includes a shaft and the head such that the head is located in the cavity and the shaft extends through the electrode pin opening defined in the reflector assembly;
- through-mounting the electrode pin to the electrode pin aperture;
- depositing a second semiconductor in the cavity such that the second semiconductor surrounds the first semiconductor and forms an emissive interface configured to emit light with the first semiconductor;
- electrically coupling an electrode connector to the second semiconductor; and
- through-mounting the electrode connector to the electrode connector aperture.

18. The method of claim 17, further comprising:
- coating a cavity surface of the cavity and an inner channel surface of a channel with an electrically conductive and reflective material; and
- electrically coupling the electrically conductive and reflective material to the second semiconductor.

19. The method of claim 17, further comprising placing a lens sheet over a light opening of the cavity, the lens sheet including at least one converging lens.

20. The method of claim 17, wherein depositing the second semiconductor in the cavity includes depositing a liquid precursor of the second semiconductor in the cavity.

21. The method of claim 17, wherein depositing the second semiconductor in the cavity includes:
- introducing a liquid precursor into the cavity; and
- curing the liquid precursor to form the second semiconductor.

22. The method of claim 17, further comprising incorporating the light-emissive device into a light-emissive display including one or more additional light-emissive devices.

* * * * *